United States Patent [19]
Chahabadi

[11] Patent Number: 5,457,722
[45] Date of Patent: Oct. 10, 1995

[54] CIRCUIT FOR FREQUENCY DIVISION BY AN ODD NUMBER

[75] Inventor: Djahanyar Chahabadi, Hildesheim, Germany

[73] Assignee: Blaupunkt-Werke GmbH, Hildesheim, Germany

[21] Appl. No.: 183,026

[22] Filed: Jan. 18, 1994

[30] Foreign Application Priority Data

Jan. 29, 1993 [DE] Germany .......................... 43 02 438.6

[51] Int. Cl.⁶ .................................................. H03K 23/66
[52] U.S. Cl. .................................. 377/47; 377/48; 377/52
[58] Field of Search ................................. 377/47–48, 52

[56] References Cited

U.S. PATENT DOCUMENTS

| 4,573,176 | 2/1986 | Yeager | 377/48 |
| 4,942,595 | 7/1990 | Baca | 377/48 |

FOREIGN PATENT DOCUMENTS 0280126  8/1988  European Pat. Off. .
0886248  11/1981  U.S.S.R. .................. 377/48

OTHER PUBLICATIONS

IBM Tech Disc. Bul "Synchronous frequency division by 2.5" Karabatsos et al. vol. 17 No. 12 May, 1975 pp. 3619–3620.
Motorola Technical Developments, Bd.11, Oct. 1990, Schaumburg, Ill., pp. 3 & 4–M. J. Johnson "A Simple Technique For Fractional Digital Division".

Primary Examiner—Margaret Rose Wambach
Attorney, Agent, or Firm—Frishauf, Holtz, Goodman, Langer & Chick

[57]  ABSTRACT

In a circuit for dividing the frequency of a received signal by an uneven number, initially another signal is derived through half-integer frequency division and thereafter divided by two. Preferably, a frequency division is performed alternately by an integer under the half-integer and by an integer above the half-integer, in order to achieve frequency division by a half-integer, whereby the toggling is performed dependent on the output signal.

9 Claims, 2 Drawing Sheets

5,457,722

CIRCUIT FOR FREQUENCY DIVISION BY AN ODD NUMBER

Cross-reference to related patent application, assigned to the assignee of the present invention, the disclosure of which is hereby incorporated by reference: corresponding U.S. Ser. No. 08/184,229, filed Jan. 19, 1994.

FIELD OF THE INVENTION

The invention relates generally to a circuit for dividing frequencies by an odd number.

BACKGROUND

For purposes of station tuning in radio receivers, a phase control loop ("Phase-Locked Loop," hereinafter "PLL") is frequently used, where the frequency of a controllable oscillator is divided, and the signal with the divided frequency is compared to the signal of a reference oscillator in a phase detector, whereby a tuning voltage is produced that can be supplied to the controllable oscillator. Dependent on the selected frequency of the reference oscillator, frequency division by an uneven (odd) number is often required to achieve the desired tuning pattern. In particular, a duty cycle of near 1 is required for analog processing of the frequency-divided signal, due to factors based on performance.

THE INVENTION

It is an object of the invention to achieve a frequency division by an odd number with a duty cycle near 1, using only simple means.

The advantage of the circuit according to the invention, is that with simple circuits that are common in the field of digital circuitry a frequency division by an odd number is made possible. The duty cycle of the frequency-divided signal, hereafter called output signal, is near 1.

An advantageous embodiment permits programming of any odd division ratios, while another advantageous embodiment permits programming of both even and odd division ratios.

DRAWINGS

Further features of the preferred embodiments will be apparent from the drawings, of which:

The same components are labeled with the same reference characters in each drawing.

DETAILED DESCRIPTION

Figure 2:
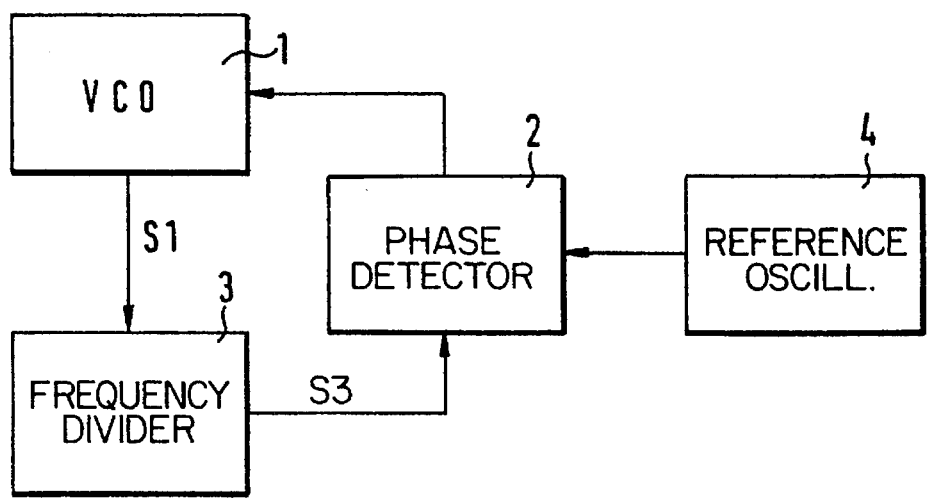
FIG. 2 is a block diagram of a generally well-known PLL circuit.

A known and often used PLL circuit for tuning a radio receiver is depicted in FIG. 2 in block diagram form. The circuit includes a voltage controllable oscillator 1, which can be supplied with a tuning voltage from a phase detector 2. The output signal S1 of the controllable oscillator is supplied to a frequency divider 3, whose output signal S3 is in a controllable division ratio relationship to the signal S1.

The phase detector 2, compares the signal S3 to the output signal of a reference oscillator 4, thus producing the tuning voltage. Depending on the frequency pattern, in individual cases it may be necessary to accomplish odd division ratios with the frequency divider 3.

Figure 1:
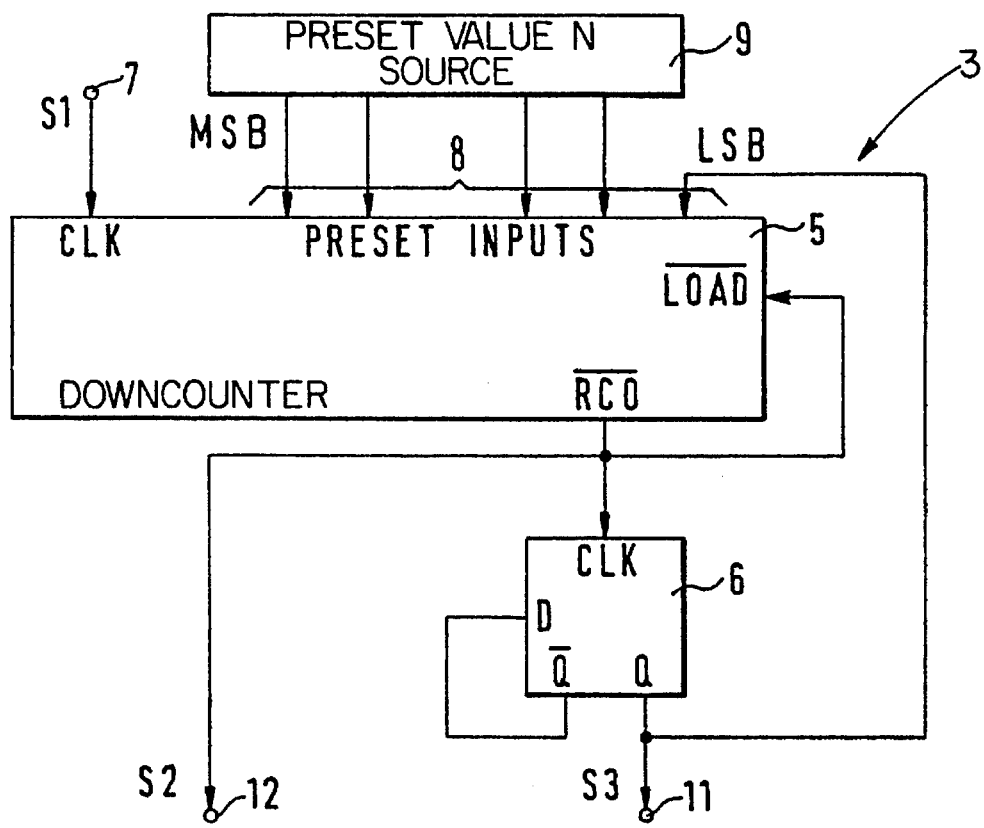
FIG. 1 is a block diagram of one embodiment of the invention.

FIG. 1 shows an exemplary embodiment of a frequency divider 3 (FIG. 2) according to the invention, which includes a downcounter 5 and a flip-flop 6. The signal S1 is supplied to the clock input CLK of the downcounter 5 via an input 7. The downcounter 5 can be set to a value supplied via preset inputs 8 upon receipt of a signal at a $\overline{\text{LOAD}}$ input. This value N, hereafter called preset value, is supplied by a device 9, that may, for instance, be an output register of a microcomputer which is used for radio station tuning, among other functions.

An $\overline{\text{RCO}}$ (Ripple Carry Out) output of the downcounter 5 is connected to the $\overline{\text{LOAD}}$ input, causing the downcounter to be set to the preset value when the counter reaches Zero. The $\overline{\text{RCO}}$ output is also connected with the clock input CLK of a flip-flop 6, whose inverting input $\overline{Q}$ is connected to the data input D, causing the flip-flop 6 to operate as a bisector, or divide-by-two element. Output Q of flip-flop 6 constitutes one output 11 of the frequency divider where the output signal S3 can be received. Output Q of flip-flop 6 is also connected to the least significant bit LSB of the preset inputs 8.

Depending on the respective logic level of the output signal Q, a division of the signal frequency S1 by either 2N+1 or 2N is effected by downcounter 5. When downcounter 5, beginning at the respective preset value, reaches 0, the flip-flop 6 is triggered, causing the output signal Q to make a logic level transition, and thus setting the respective alternate division ratio at the downcounter 5 (e.g. from 2N to 2N+2. The average value of the resulting division ratio of the downcounter is, therefore, (2N+½). Flip-flop 6 divides the frequency of the resulting signal S2, which can be obtained at another output 12, by 2, and thus produces the output signal S3 with the duty cycle of 2N/(2N+1), which approaches 1 when N is a large number. In total, for obtaining signal S3 the frequency of the signal S1 is thus divided by 4N+1.

Figure 3:
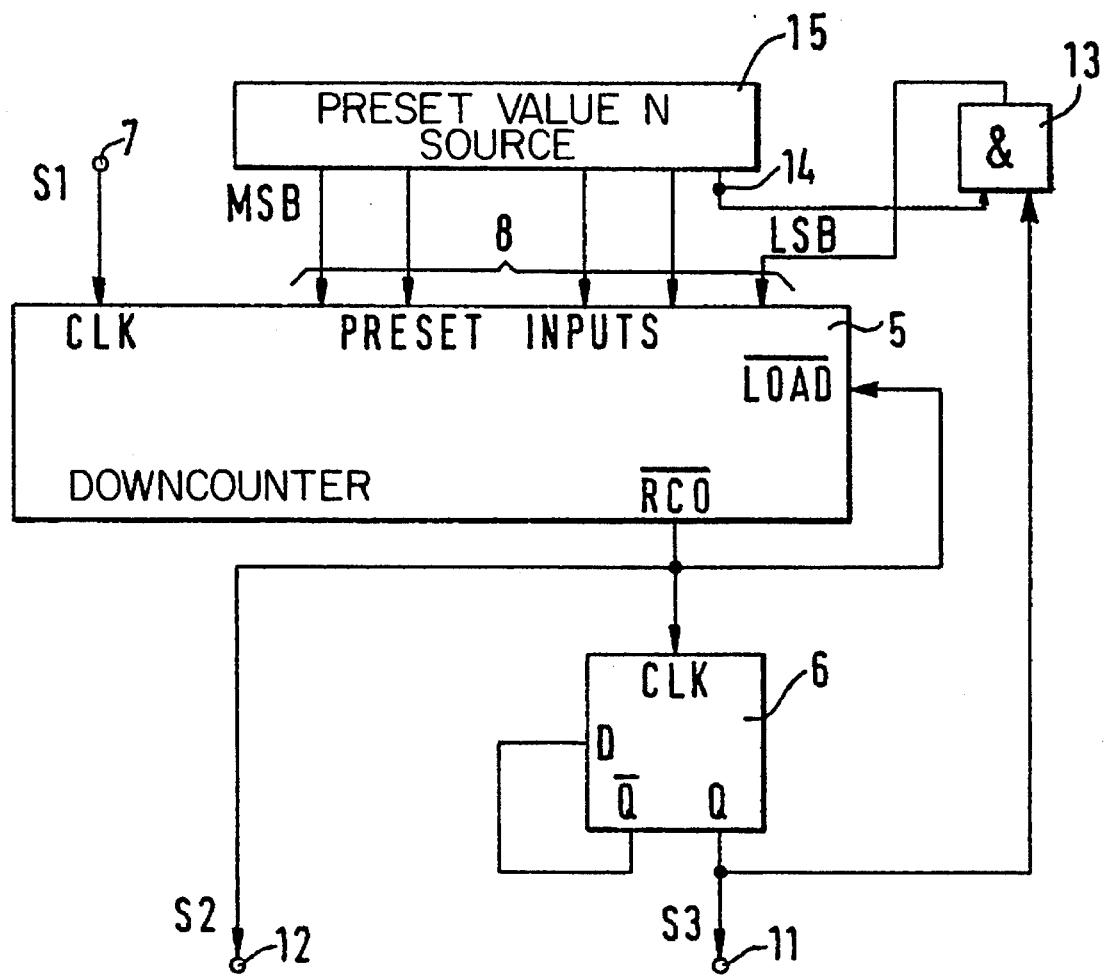
FIG. 3 is a block diagram of another embodiment of the invention.

In the alternate embodiment according to FIG. 3, compared with the embodiment of the invention according to FIG. 1, an AND-gate 13 is inserted between output Q of flip-flop 6 and the least significant bit of the preset inputs 8 of downcounter 5. This AND-gate 13 can be controlled by another output 14 of a device 15, which otherwise supplies the additional bits for the preset inputs 8, and thus controls the division ratio.

Depending on the logic level at the additional output 14, the frequency division occurs through downcounter 5, either dependent upon, or independently of, the output signal S3. If AND-gate 13 is open to the output signal S3, the circuit according to FIG. 3 functions like the circuit according to FIG. 1. But if supply of the output signal to the least significant bit (LSB) of the preset inputs 8 is blocked by the AND-gate 13, an even-numbered division ratio results. Therefore, aside from the division ratios of M=4N+1, division ratios of M=4N can also be accomplished with the circuit illustrated in FIG. 3.

Various changes and modifications are possible within the scope of the inventive concept.

What is claimed is:

1. Circuit for dividing the frequency of a received signal by an odd number to produce a result, comprising:

first means for dividing the frequency of the received signal by a divisor having multiple bits, including a least significant bit (LSB), to generate a first output;

second means for dividing the first output to generate a second output that is provided as said LSB to said first means; and wherein said second output is the result produced by the circuit.

2. The circuit of claim 1, wherein bits of said divisor other than said LSB represent an integer N, and said first means carries out frequency division alternately by 2N and 2N+1, depending on the value of said second output, to produce an average frequency division by (2N+½).

3. The circuit of claim 2, wherein said first means comprises a programmable downcounter having a clock input to which is coupled the received signal, and wherein said second means comprises a flip-flop, the output of said downcounter being coupled to a $\overline{\text{LOAD}}$ input of said downcounter, and wherein the bits of the divisor other than the LSB are preset to represent a desired division ratio.

4. The circuit of claim 3, further comprising an AND-gate having one input coupled to said second output and a second input coupled to a control signal, said AND-gate having its output provided as said LSB to said first means, and control means for generating said control signal to open said AND-gate for passing said second output through said AND-gate when an odd number is desired as a division ratio.

5. The circuit of claim 1, wherein said first means comprises a programmable downcounter having a clock input to which is coupled the received signal, and wherein said second means comprises a flip-flop, the output of said downcounter being coupled to a $\overline{\text{LOAD}}$ input of said downcounter, and wherein the bits of the divisor other than the LSB are preset to represent a desired division ratio.

6. The circuit of claim 1, further comprising an AND-gate having one input coupled to said second output and a second input coupled to a control signal, said AND-gate having its output provided as said LSB to said first means, and control means for generating said control signal to open said AND-gate for passing said second output through said AND-gate when an odd number is desired as a division ratio.

7. Circuit for dividing the frequency of a received signal by an odd number to produce a result, comprising:

a programmable downcounter having a plurality of inputs respectively corresponding to a multiple-bit divisor which includes a least significant bit (LSB), a clock input to which is coupled the received signal, and a $\overline{\text{LOAD}}$ input, an output of said downcounter being coupled to said $\overline{\text{LOAD}}$ input;

a flip-flop coupled to said output of said downcounter to provide an output to the LSB input of said downcounter; and wherein said output of said flip-flop is the result produced by the circuit.

8. The circuit of claim 7, wherein bits of said divisor other than said LSB represent an integer N, and said downcounter carries out frequency division alternately by 2N and 2N+1, depending on the state of said flip-flop, to produce an average frequency division by (2N+½).

9. The circuit of claim 7, further comprising an AND-gate having one input coupled to said output of said flip-flop and a second input coupled to a control signal, said AND-gate having its output provided to said LSB input of said downcounter, and control means for generating said control signal to open said AND-gate for passing said output of said flip-flop through said AND-gate when an odd number is desired as a division ratio.

\* \* \* \* \*